United States Patent [19]

Tsuji

[11] Patent Number: 4,855,869
[45] Date of Patent: Aug. 8, 1989

[54] CHIP CARRIER

[75] Inventor: Mutsuo Tsuji, Tokyo, Japan

[73] Assignee: NEC Corporation, Tokyo, Japan

[21] Appl. No.: 98,218

[22] Filed: Sep. 18, 1987

[30] Foreign Application Priority Data

Sep. 19, 1986 [JP] Japan ................................ 61-219414

[51] Int. Cl.$^4$ .............................................. H05K 7/20
[52] U.S. Cl. ................................... 361/386; 174/52.3;
357/81; 357/79; 361/388
[58] Field of Search ............. 165/80, 185; 174/16 HS,
174/52 S; 357/81, 79; 361/386–389, 414;
29/832, 840, 843

[56] References Cited

U.S. PATENT DOCUMENTS

| 3,777,220 | 12/1973 | Tatsuko et al. |
|---|---|---|
| 3,993,123 | 11/1976 | Chu et al. |
| 4,093,971 | 6/1978 | Chu et al. |
| 4,109,707 | 8/1978 | Wilson et al. |
| 4,110,549 | 8/1978 | Goetzke et al. |
| 4,231,154 | 11/1980 | Gazdik et al. ........................ 29/840 |
| 4,245,273 | 1/1981 | Feinberg et al. |
| 4,398,208 | 8/1983 | Murano et al. |
| 4,498,122 | 2/1985 | Rainal. |
| 4,509,096 | 4/1985 | Baldwin et al. |
| 4,546,410 | 10/1985 | Kaufman. |
| 4,628,990 | 12/1986 | Hagihara et al. |
| 4,644,385 | 2/1987 | Nakanishi et al. |
| 4,652,970 | 3/1987 | Watari et al. |
| 4,709,301 | 11/1987 | Yamagati ............................ 361/387 |
| 4,744,007 | 3/1988 | Watari et al. |

FOREIGN PATENT DOCUMENTS 0225656 12/1983 Japan ...................................... 357/81
0044854 3/1984 Japan ...................................... 357/81

OTHER PUBLICATIONS

Chu, IBM Technical Disclosure Bulletin, vol. 8, No. 11, Apr. 1966, "Counter-Flow Cooling System", p. 1692.
Doo et al, IBM Technical Disclosure Bulletin, vol. 20, No. 4, Sep. 1977, "Method of Effective Cooling of a High Power Silicon Chip", pp. 1436–1437.
Hwang et al, IBM Technical Disclosure Bulletin, vol. 20, No. 11A, Apr. 1978, "Conduction Cooling Module", pp. 4334–4335.
Chu et al, IBM Technical Disclosure Bulletin, vol. 21, No. 6, Nov. 1978, "Solid Encapsulated Module", pp. 2435–2436.
Older et al, Non-Hermetic Packaging Techniques for Hybrids, Jun. 1979, pp. 137–139.

Primary Examiner—A. D. Pellinen
Assistant Examiner—Greg Thompson
Attorney, Agent, or Firm—Burns, Doane, Swecker & Mathis

[57] ABSTRACT

A chip carrier including a substrate having a plurality of pads formed on the upper and lower surfaces thereof and wirings to connect the pads. The chip carrier also includes an integrated circuit chip having a plurality of leads connected to corresponding ones of the pads. A first metal frame is included which is soldered to the upper surface of the substrate so as to surround the integrated circuit chip. The chip carrier also includes a second metal frame which is seam-welded to the upper end of the first metal frame so as to surround the integrated circuit chip and a plate is soldered to the upper end of the second metal frame so as to cover the integrated circuit chip.

20 Claims, 1 Drawing Sheet

UNILATERAL DIRECTION CONTROL FOR DENTAL SYRINGE

BACKGROUND

1. Field of Invention

This invention relates to control over the direction of the exit path of agents delivered from a dental syringe wherein that dental syringe is used to direct and deliver controlled amounts of various agents including air and water.

2. Discussion of Prior Art

Dental syringes for delivery of controlled amounts of various agents including air and water are present in the prior art. Examples can be seen by referring to U.S. Pat. Nos. 4,619,612; 4,531,912; 4,248,589; 4,227,878; 4,026,025; 3,511,235; 3,393,676; and 2,066,313 which demonstrate various designs of these syringes. The syringes mentioned above are hand held devices for use during delivery of dental care. These syringes allow the user to control the selection of agent or agents, the quantity of the desired agent or agents, and the direction of the exit path of the selected agent or agents in relation to the handle of that syringe.

In all but one instance, control over the exit path direction requires the use of both hands. To redirect the exit path the user of that syringe must use one hand to hold the syringe handle and the other hand to grasp the nozzle and rotate that nozzle in its connection with the syringe. It is rotation of the nozzle in that connection which alters the direction of the exit path.

Only the most current design, that disclosed in U.S. Pat. No. 4,619,612 provides for exit path direction control by the hand user to hold and operate the syringe under discussion. There is no mention of this advantage in the patent document other than the fact that its presence is demonstrated in the drawings as an enlarged area on the nozzle adjacent to the syringe head. In production of this design the ability to control exit path direction with the operating hand is facilitated by placement of a grasping means, in the area mentioned above, which is within reach of the operating hand and is used by that hand to rotate the nozzle. The nozzle, in all of the above mentioned syringe designs, is connected to the syringe so as to allow rotation of the nozzle. The above described nozzles are curved so that rotation of the nozzle in its connection with the syringe acts to change the exit path direction in relation to the handle of the syringe. In the design providing the above mentioned grasping means, that grasping means is a part of the mold for the nozzle. Any nozzle produced with that mold must include that grasping means. The grasping means cannot be offered as an option for the nozzle of that syringe. To provide a nozzle without that grasping means a seperate mold would be required. The grasping means cannot be taken from one syringe nozzle and placed on another syringe nozzle. The grasping means can only be utilized with the design it is incorporated into and molded with. If the grasping means is damaged the entire nozzle must be replaced. If the consumer desires the grasping means, the syringe model including that grasping means must be purchased. In many situations the syringe model including that grasping means will not be complimentary with other aspects of the consumers dental care facility. The grasping means cannot be obtained seperatly for use on any other syringe.

OBJECTS AND ADVANTAGES

Accordingly several objects and advantages of my invention are now disclosed. The present invention provides for a grasping means which is fabricated seperately from the nozzle described above. This allows the combination of the nozzle and grasping means to be temporary in nature if desired or permanent if this is desired. By fabricating the nozzle and grasping means seperately, the nozzle can be utilized without the grasping means, in situations where the grasping means is not wanted, without the necessity for duplicate nozzle molds or production facilities. In those instances where the grasping means is requested, it can be attached to the nozzle during construction and assembly or provided as an aftermarket addition to that nozzle. Permanent attachment of the grasping means to the nozzle can be accomplished by a variety of methods including adhesion, soldering, welding, overlaying of both the grasping means and the nozzle with an appropriate overlay material, or any other method of permanent combination. Temporary attachment of the grasping means to the nozzle can be accomplished by a variety of methods including frictional contact, physical engagement, or any other method of temporary combination. The present invention provides for a grasping means which if temporarily attached can be removed from one syringe nozzle and placed on another syringe nozzle, and which can be replaced without replacement of the nozzle. The present invention provides for a grasping means which can be utilized with any syringe mode even if that syringe was not designed to provide for unilateral control over the exit path direction. The present invention provides for a grasping means which can be obtained for use on existing syringe models, thereby providing the consumer with the ability to retain equipment presently in use and still obtain the benefits of unilateral control over the exit path direction.

Further objects and advantages of my invention will become apparent from a consideration of the drawings and ensuing description of the invention.

Figure 1:
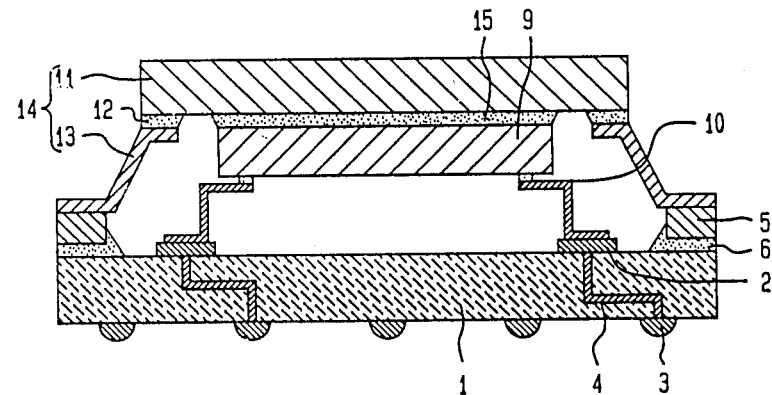
FIG. 1 is an external perspective view of a dental syringe of the type to which the present invention applies with the present invention diagrammatically included.

LIST OF REFERENCE NUMERALS 1 handle of syringe
2 head of syringe
3 supply source of agents
4 agent control mechanisms
5 rotary connection of nozzle to syringe
6 grasping means
7 angled tip of nozzle
8 discharge orifice
9 shank of nozzle
10 nozzle
12 curved area of nozzle
13 exit path of agents
14 attachment of grasping means to nozzle
111 syringe

DESCRIPTION OF THE PREFERRED EMBODIMENTS

The principals of the present invention are useful when applied to a dental syringe generally indicated at 111. The syringe at 111 includes a handle 1 for the purpose of holding the syringe 111 during use, a head 2 which serves in combination with the handle 1 to encase the internal workings of the syringe 111, a supply 3 of the agents it directs and delivers, control mechanisms 4 for regulating the volume of and for selection of the agents, a connection 5 between the nozzle 10 and head 2 which allows rotation, a nozzle 10 which conducts the agents from the head 2 through the nozzle's shank 9 through the nozzle's curved portion 12 through the nozzle's angled tip 7 and on to exit from the nozzle's discharge orifice 8 along the agents exit path 13.

The nozzle 10 is attached to the head 2 by the rotary connection 5 so that rotation of the nozzle's shank 9 facilitates alteration of the direction of the agents exit path 13 in relation to the handle 1.

The present invention provides for rotation of the nozzle's shank 9 in the rotary connection 5 by placing a grasping means 6 on the nozzle 10. The grasping means 6 is designed for use by the hand holding and operating the syringe 111 while allowing that hand to remain in an operating position. The grasping means 6 is attached to the nozzle 10. The attachment of the grasping means 6 to the nozzle 10 is generally indicated at 14. The grasping means 6 is placed in close proximity to the head 2 of the syringe 111 and is designed and positioned for use by the hand holding and operating the syringe 111. The attachment 14 can be temporary or permanent.

As the grasping means 6 has attachment 14 to the nozzle 10, rotation of the grasping means 6 will cause rotation of the nozzle's shank 9 leading to a change in the direction of the exit path 13 in relation to the handle 1. The grasping means 6 will not interfere with dissasembly of the nozzle 10 from the head 2 and will allow sterilization by existing techniques.

OPERATION OF THE INVENTION

The present invention provides a grasping means to be attached to the nozzle of a dental syringe as described above. The grasping means allows the user of that syringe to control the direction of the exit path described above with the hand used to hold and operate that syringe. This direction control is accomplished by reaching forward with the thumb and forefinger of that hand to grasp and rotate the grasping means. This rotation of the grasping means causes rotation of the nozzle in its connection with the syringe which thereby redirects the exit path of the agents.

While the above description contains many specificities, the reader should not construe these as limitations on the scope of the invention, but merely as exemplifications of preferred embodiments thereof. Those skilled in the art will envision other possible variations within the scope of the invention.

For example, skilled artisans will be able to change the dimensions and shapes of the various embodiments. Furthermore, various methods of attachment may be employed between the grasping means and the nozzle. For example, attachment could be accomplished utilizing one or more set screws. Accordingly the reader is requested to determine the scope of this invention by the appended claims and their legal equivalents, and not by the examples which have been given.

I claim:

1. A dental syringe including a handle and a nozzle and means to rotate said nozzle with respect to said handle wherein:
    said syringe is used to direct and deliver controlled amounts of various agents including air and water,
    said nozzle is connected to said syringe so as to allow rotation of said nozzle,
    said means to rotate is for rotating said nozzle at said connection,
    said nozzle includes a discharge orifice for said agents,
    said agents depart said discharge orifice along an exit path, and wherein
    said rotation causes redirection of said exit path,
    said redirection is relative to said handle of said syringe,
    said means to rotate is provided for use by the hand which holds and operates said syringe, and wherein
    said means to rotate allows said hand to remain in an operating position while utilizing said means to rotate, and wherein
    a grasping means is provided to facilitate said means to rotate, and wherein
    said grasping means is removably attached to said nozzle,
    said grasping means being provided with means for preventing relative rotation between said nozzle and said grasping means whereby said grasping means and said nozzle rotate as a unit,
    said grasping means is of a size to allow operation by said hand, and wherein
    said grasping means has a design to prevent slipping of said hand during said rotation.

2. The invention of claim 1 wherein said grasping means is attached to said nozzle frictional contact.

3. The invention of claim 1 wherein said grasping means is attached to said nozzle utilizing an appropriate number of set screws.

* * * * *

UNITED STATES PATENT AND TRADEMARK OFFICE
CERTIFICATE OF CORRECTION

PATENT NO. : 4,855,869
DATED : August 8, 1989
INVENTOR(S) : Mutsuo Tsuji

It is certified that error appears in the above-indentified patent and that said Letters Patent is hereby corrected as shown below:

Columns 1-4 should be deleted to appear as per attached colums 1-4.

Signed and Sealed this

Ninth Day of November, 1993

Attest:

BRUCE LEHMAN

Attesting Officer

Commissioner of Patents and Trademarks

CHIP CARRIER

BACKGROUND OF THE INVENTION

The invention relates to a chip carrier.

An example of prior art chip carriers is shown in FIG. 4 of U.S. Pat. No. 4,652,970. In the carrier shown in the U.S. Patent, a substrate 31 and a cover 33 are fixed to side surfaces of the substrate 31 by an epoxy adhesive 36. The sealing with such a resin type adhesive as the epoxy adhesive, however, is inferior in reliability, and a chip 32 mounted within the carrier is susceptible to the influence of the environment surrounding the carrier. Further, the peripheral dimension of the substrate 31 and the inner diameter of the cover 33 are required to have an extremely high precision. This normally requires a high level processing technique which thereby inevitably increases the cost.

SUMMARY OF THE INVENTION

According to an aspect of the invention, there is provided a chip carrier which comprises: a substrate having a plurality of pads formed on the upper and the lower surfaces thereof and wirings connecting the pads; an integrated circuit chip having a plurality of leads connected to corresponding ones of the pads; a first metal frame fixed to the upper surface of the substrate so as to surround the chip; a second metal frame fixed to the upper end of the first metal frame so as to surround the chip; and a plate fixed to the upper end of the second metal frame so as to cover the chip.

BRIEF DESCRIPTION OF THE DRAWINGS

Other features and advantages of the invention will be made more apparent by the detailed description hereunder when taken in conjunction with the accompanying drawings in which:

FIG. 1 is a cross-sectional view of a first embodiment of the invention; and

Figure 2:
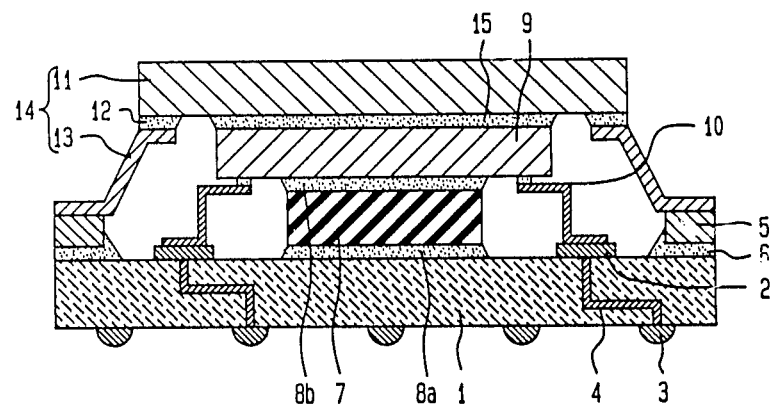
FIG. 2 is an exterior side view of a dental syringe of the type to which the present invention applies with a cross sectional view of the present invention shown diagrammatically.

FIG. 2 is a cross-sectional view of a second embodiment of the invention.

In the drawings, the same reference numerals represent the same structural elements.

DETAILED DESCRIPTION OF THE PREFERRED EMBODIMENTS

Referring now to FIG. 1, a first embodiment of the invention comprises a ceramic substrate 1, an integrated circuit (IC) chip 9 mounted on the substrate 1, and a cap 14.

Pads 2 and 3 are formed on the upper surface and the lower surface of the substrate 1, respectively. Conductive wirings 4 for electrically connecting the pads 2 and the pads 3 are formed. A first metal frame 5 made of a metal material suitable for seam-welding such as kovar including iron, nickel and cobalt as principal components is fixed on the upper surface of the substrate 1 by an adhesive 6 such as the silver solder so as to surround the chip 9. The portion on the substrate on which the metal frame 5 is to be fixed is metalized in advance. The chip 9 is mounted on the upper surface of the substrate 1 in face-down configuration, and leads 10 of the chip 9 are connected to the pads 2. A cap 14 comprises a plate 11 made of a thermally conductive material, such as copper (Cu)/tungsten (W) and BeO, and a second metal frame 13 fixed with an adhesive 12 such as the silver solder to the peripheral portions of the plate 11. The plate is connected to the chip 9 by an adhesive 15 of the epoxy group containing silver powder having an excellent thermal conductivity. The frame 13 is fixed to the frame 5 by the seam-welding so that the chip 9 is sealed within a space defined by the plate 11, the frames 13 and 5 and the substrate 1.

The method of assembling the embodiment will now be described. The frame 5 is fixed to the substrate 1 by the silver solder 6 while the frame 13 is fixed to the plate 11 by the silver solder 12. The leads 10 are connected to the pads 2 on the upper surface of the substrate 1 by thermocompression bonding. The chip 9 and the plate 11 are then fixed by the adhesive 15. Finally, the frames 5 and 13 are connected by the seam-welding.

Referring next to FIG. 2, a second embodiment of the invention has the same structure as the first embodiment except that a spacer 7 made of silicone rubber or the like is provided between the chip 9 and the substrate 1.

The method of assembling the embodiment will be described hereunder.

The first metal frame 5 is fixed to the substrate 1 by the silver solder 6 while the second metal frame 13 is fixed to the plate 11 by the silver solder 12. Then, the spacer 7 is fixed to the upper surface of the substrate by an adhesive 8a of the silicone group. The chip 9 is fixed to the upper surface of the spacer 7 by an adhesive 8b of the silicone group 8b. Then, the leads 10 of the chip 9 are connected to the pads 2 on the upper surface of the substrate by the thermocompression bonding. The chip 9 and the plate 11 are secured more firmly than in the first embodiment because of the spacer 7 inserted between the chip 9 and the substrate 1.

As described in detail in the foregoing, since the chip carrier of the invention is sealed by the use of the soldering and the seam-welding, highly reliable sealing can be achieved. The dimensional precision required for the substrate and the first metal frame 5, on the other hand, becomes less stringent.

While this invention has been described in conjunction with the preferred embodiments thereof, the invention is not limited thereto as it is possible for those skilled in the art to put this invention into practice in other embodiments that come within the scope of the claims.

What is claimed is:

1. A chip carrier comprising:
   a substrate having a plurality of pads formed on the upper and lower surfaces thereof and wirings to connect said pads;
   an integrated circuit chip having a plurality of leads connected to corresponding ones of said pads on said upper surface of said substrate;
   a first metal frame soldered to the upper surface of said substrate so as to surround said integrated circuit chip;
   a second metal frame having an upper end and a lower end, said lower end of said second metal frame seam-welded to the upper end of said first metal frame so as to surround said integrated circuit chip; and
   a plate having a bottom surface, said plate soldered only at a portion of said bottom surface to the upper end of said second metal frame so as to cover said integrated circuit chip.

2. The chip carrier as set forth in claim 1, further comprising: a spacer inserted between said integrated circuit chip and the upper surface of said substrate.

3. A chip carrier as set forth in claim 1, wherein said first metal frame is made of material suitable for seam-welding, and
wherein said plate is made of a thermally conductive material.

4. The chip carrier as set forth in claim 1, wherein said first metal frame is made from a material including iron, nickel and cobalt.

5. The chip carrier as set forth in claim 1, wherein said plate is made of a material including at least one of copper, tungsten and BeO.

6. The chip carrier as set forth in claim 1, wherein said upper end of said second metal frame is soldered to peripheral portions of said bottom surface of said plate.

7. The chip carrier as set forth in claim 1, wherein said first metal frame is soldered to the upper surface of said substrate with silver solder, and
wherein said upper end of said second metal frame is soldered to peripheral portions of said bottom surface of said plate with silver solder.

8. The chip carrier as set forth in claim 1, wherein said plate is adhesively secured to said integrated circuit chip by an adhesive that is thermally conductive, and wherein said plurality of leads of said integrated circuit chip are connected to said corresponding pads by thermocompression bonding.

9. The chip carrier as set forth in claim 8, wherein said plate is adhesively secured to said integrated circuit chip by an adhesive of the epoxy group.

10. The chip carrier as set forth in claim 9, wherein said first metal frame is made of a material suitable for seam-welding, and
wherein said plate is made of a thermally conductive material.

11. The chip carrier as set forth in claim 10, wherein said adhesive of the epoxy group includes silver powder.

12. The chip carrier as set forth in claim 2, wherein said spacer is made of a silicone rubber.

13. The chip carrier as set forth in claim 12, wherein said spacer is adhesively secured to said upper surface of said substrate, and wherein said integrated circuit chip is adhesively secured to the upper surface of said spacer.

14. The chip carrier as set forth in claim 13, wherein said spacer is adhesively secured to said upper surface of said substrate and the upper surface of said spacer is adhesively secured to said integrated circuit chip by an adhesive of the silicone group.

15. The chip carrier as set forth in claim 2, wherein said first metal frame is made of material suitable for seam-welding,
wherein said plate is made of a thermally conductive material,
wherein said plate is adhesively secured to said integrated circuit chip by an adhesive that is thermally conductive,
wherein said plurality of leads of said integrated circuit chip are connected to corresponding said pads on said upper surface of said substrate by thermocompression bonding, and
wherein said spacer is adhesively secured to the upper surface of said substrate and said integrated circuit chip is adhesively secured to the upper surface of said spacer.

16. The chip carrier as set forth in claim 2, wherein said first metal frame is soldered to the upper surface of said substrate with silver solder, and
wherein said upper end of said second metal frame is soldered to peripheral portions of said bottom surface of said plate with silver solder.

17. A method of forming a chip carrier comprising the steps of:
providing a substrate having a plurality of pads formed on the upper and lower surfaces thereof and wirings to connect said pads;
providing an integrated circuit chip having a plurality of leads;
connecting said plurality of leads of said integrated circuit chip to corresponding ones of said pads on said upper surface of said substrate;
surrounding said integrated circuit chip with a first metal frame soldered to said upper surface of said substrate;
surrounding said integrated circuit chip with a second metal frame, said second metal frame having an upper end and a lower end, said lower end of said second metal frame seam-welded to the upper end of said first metal frame; and
covering said integrated circuit chip with a plate, said plate having a bottom surface, said plate soldered only at a portion of said bottom surface to the upper end of said second metal frame.

18. The method of forming a chip carrier as set forth in claim 17, further comprising the step of:
inserting a spacer between said integrated circuit chip and said upper surface of said substrate.

19. The method of forming a chip carrier as set forth in claim 18, further comprising the steps of:
adhesively securing said plate to said integrated circuit chip by an adhesive that is thermally conductive;
adhesively securing said spacer to said upper surface of said substrate;
adhesively securing said integrated circuit chip to the upper surface of said spacer;
and wherein said plurality of leads of said integrated circuit chip are connected to corresponding said pads on said upper surface of said substrate by thermocompression bonding.

20. The method of forming a chip carrier as set forth in claim 19, wherein
said spacer is adhesively secured to said upper surface of said substrate and is adhesively secured to said integrated circuit chip by an adhesive of the silicone group,
wherein said first metal frame is soldered to the upper surface of said substrate with silver solder,
wherein said upper end of said second metal frame is soldered to peripheral portions of said bottom surface of said plate with silver solder, and
wherein said plate is adhesively secured to said integrated cicuit chip by an adhesive of the epoxy group.

* * * * *